(12) United States Patent  
Zhuang et al.

(10) Patent No.: US 9,911,709 B1
(45) Date of Patent: Mar. 6, 2018

(54) SEMICONDUCTOR DEVICE AND SEMICONDUCTOR MANUFACTURING PROCESS

(71) Applicant: Advanced Semiconductor Engineering, Inc., Kaohsiung (TW)

(72) Inventors: Chun-Jun Zhuang, Kaohsiung (TW); Wei-Hang Tai, Kaohsiung (TW); Pin-Ha Chuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/335,351

(22) Filed: Oct. 26, 2016

(51) Int. Cl.
  *H01L 23/00* (2006.01)
  *H01L 23/24* (2006.01)
  *H01L 25/00* (2006.01)
  *H01L 25/065* (2006.01)

(52) U.S. Cl.
  CPC .............. *H01L 24/17* (2013.01); *H01L 23/24* (2013.01); *H01L 24/16* (2013.01); *H01L 24/73* (2013.01); *H01L 25/0657* (2013.01); *H01L 25/50* (2013.01); *H01L 2224/1403* (2013.01); *H01L 2224/16145* (2013.01); *H01L 2224/17155* (2013.01); *H01L 2224/17179* (2013.01); *H01L 2224/17517* (2013.01); *H01L 2224/73204* (2013.01); *H01L 2225/06513* (2013.01); *H01L 2225/06517* (2013.01); *H01L 2225/06527* (2013.01); *H01L 2225/06568* (2013.01); *H01L 2924/3511* (2013.01)

(58) Field of Classification Search
  CPC ......... H01L 24/17; H01L 24/16; H01L 24/73; H01L 23/24; H01L 25/50; H01L 25/0657; H01L 2224/1403; H01L 2224/16145; H01L 2924/3511; H01L 2224/17155; H01L 2224/73204; H01L 2224/17179; H01L 2225/06513
  See application file for complete search history.

(56) References Cited

U.S. PATENT DOCUMENTS

| | | | |
|---|---|---|---|
| 7,019,407 B2 | 3/2006 | Chen et al. | |
| 7,425,458 B2 | 9/2008 | Seshan | |
| 7,425,468 B2 | 9/2008 | Wang et al. | |
| 2006/0163729 A1* | 7/2006 | Lin | ...... H01L 23/3128 257/738 |
| 2013/0043583 A1 | 2/2013 | Wu et al. | |
| 2015/0171043 A1 | 6/2015 | Lee et al. | |

* cited by examiner

*Primary Examiner* — Roy Potter
*Assistant Examiner* — Paul Patton
(74) *Attorney, Agent, or Firm* — Foley & Lardner LLP; Cliff Z. Liu

(57) ABSTRACT

A semiconductor device includes a first semiconductor die, a second semiconductor die and a plurality of supporting structures. The first semiconductor die includes a plurality of first bumps disposed adjacent to a first active surface thereof. The second semiconductor die includes a plurality of second bumps disposed adjacent to a second active surface thereof. The second bumps are bonded to the first bumps. The supporting structures are disposed between the first active surface of the first semiconductor die and the second active surface of the second semiconductor die. The supporting structures are electrically isolated and are disposed adjacent to a peripheral region of the second active surface of the second semiconductor die.

19 Claims, 7 Drawing Sheets

SEMICONDUCTOR DEVICE AND SEMICONDUCTOR MANUFACTURING PROCESS

BACKGROUND

1. Field of the Disclosure

The present disclosure relates to a semiconductor device and a semiconductor manufacturing process for manufacturing the same, and more particularly to a semiconductor device including a plurality of supporting structures to prevent warpage and a method for manufacturing the same.

2. Description of the Related Art

A semiconductor device may include a mother die and a daughter die (e.g., a memory die) disposed on and electrically connected to the mother die. For the daughter die, a coefficient of thermal expansion (CTE) of a metal material of a circuit layer on an active surface may be different from a CTE of a polymer material of a passivation layer on the active surface and a CTE of a semiconductor material of a main body of the daughter die. Thus, during a reflow process of the semiconductor device, warpage of the daughter die can occur, which can result in misalignment and non-joint formation between bumps of the daughter die and bumps of the mother die, which can adversely affect a reliability of the semiconductor device.

SUMMARY

In an aspect according to some embodiments, a semiconductor device includes a first semiconductor die, a second semiconductor die and a plurality of supporting structures. The first semiconductor die includes a first active surface and a plurality of first bumps disposed adjacent to the first active surface. The second semiconductor die includes a second active surface and a plurality of second bumps disposed adjacent to the second active surface, where the second bumps are bonded to respective ones of the first bumps. The supporting structures are disposed between the first active surface of the first semiconductor die and the second active surface of the second semiconductor die. The supporting structures are electrically isolated and are disposed adjacent to a peripheral region of the second active surface of the second semiconductor die.

In an aspect according to some embodiments, a semiconductor device includes a first semiconductor die, a second semiconductor die, a plurality of connecting structures and a plurality of supporting structures. The first semiconductor die includes a first active surface and a plurality of first bumps disposed adjacent to the first active surface. The second semiconductor die includes a second active surface and a plurality of second bumps disposed adjacent to the second active surface. The connecting structures connect the first bumps and respective ones of the second bumps. The supporting structures are disposed between the first active surface of the first semiconductor die and the second active surface of the second semiconductor die. The supporting structures are cured from a supporting material, and a gel-point temperature of the supporting material is greater than a melting temperature of a material of the connecting structures.

In an aspect according to some embodiments, a semiconductor manufacturing process includes: (a) providing a first semiconductor die including a first active surface and a first bump disposed adjacent to the first active surface; (b) disposing a supporting material on the first active surface of the first semiconductor die; (c) attaching a second semiconductor die to the first semiconductor die, where the second semiconductor die has a second active surface, a second bump and a connecting structure, the second bump is disposed adjacent to the second active surface, and the connecting structure is disposed between the second bump and the first bump; and (d) conducting a reflow process, where the supporting material is in a B-stage state when the connecting structure is melted.

DETAILED DESCRIPTION

Figure 1:
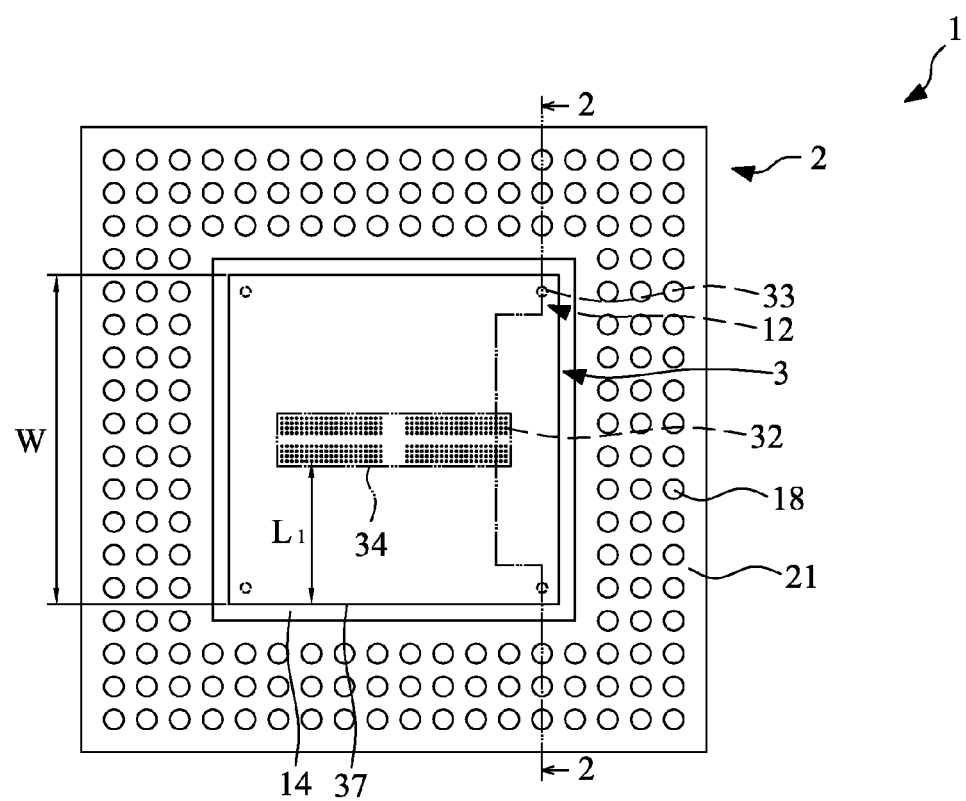
FIG. 1 illustrates a top view of a semiconductor device according to some embodiments of the present disclosure.

Some embodiments of the present disclosure provide an improved semiconductor device including a plurality of dummy supporting structures to support a daughter die for reducing a warpage of the daughter die.

Bumps of a daughter die may be bonded to bumps of a mother die by a solder so as to provide electrical connection between the mother die and the daughter die as well as to provide support to the daughter die. However, the daughter die may be a thin die (e.g., a thickness thereof may be less than about 75 μm), a pitch between the bumps of the daughter die may be a fine pitch (e.g., the pitch may be less than about 40 μm) and the bumps of the daughter die may be disposed so as to be concentrated in a central area or region of the daughter die (that is, the bumps of the daughter die may not be evenly distributed on an entire active surface of the daughter die). For example, a bump area may be about 15% or less of a total area of the daughter die. Thus, there is a relatively large peripheral area or region of the daughter die that is not supported by the bumps of the daughter die and the bumps of the mother die, and is suspended without support, which results in a convex warpage of the daughter die due to gravity.

In addition, due to a CTE mismatch between a metal material of a circuit layer, a polymer material of a passivation layer and a semiconductor material of a main body of the daughter die, the warpage of the daughter die may convert to a concave warpage from a convex warpage at about 210° C. during a temperature rise. Further, the warpage of the daughter die may convert back to a convex warpage from a concave warpage at about 230° C. during a temperature drop. Such variation of the warpage of the daughter die can result in misalignment and non-joint formation between the bumps of the daughter die and the bumps of the mother die, which can adversely affect a reliability of the semiconductor device. In addition, when a convex warpage occurs, a gap between a corner of the daughter die and an active surface of the mother die may be very small or even zero (that is, the corner of the daughter die contacts the active surface of the mother die), which can render it difficult for an underfill to enter a space between the mother die and the daughter die to cover and protect the bumps of the daughter die and the bumps of the mother die.

To address the above issues, an improved structure is formed that provides dummy supporting structures to support a peripheral region of a daughter die. The techniques described may be helpful to reduce a warpage of the daughter die during a reflow process. In some embodiments, the supporting structures may be additional dummy bumps of the daughter die bonded to additional dummy bumps of a mother die. In some embodiments, the supporting structures may be formed from an adhesive material that is in a B-stage (semi-melted or semi-soft) state at a melting temperature of a solder that connect bumps of the daughter die and bumps of the mother die. Thus, the adhesive material can adhere to both the daughter die and the mother die at a reflow temperature. The warpage of the daughter die can be reduced because mechanical and physical supports are provided at the peripheral region of the daughter die; thus, a narrow gap between a corner of the daughter die and an active surface of the mother die may be avoided, and improved alignment and joint formation between the bumps of the daughter die and the bumps of the mother die may be obtained.

Figure 2:
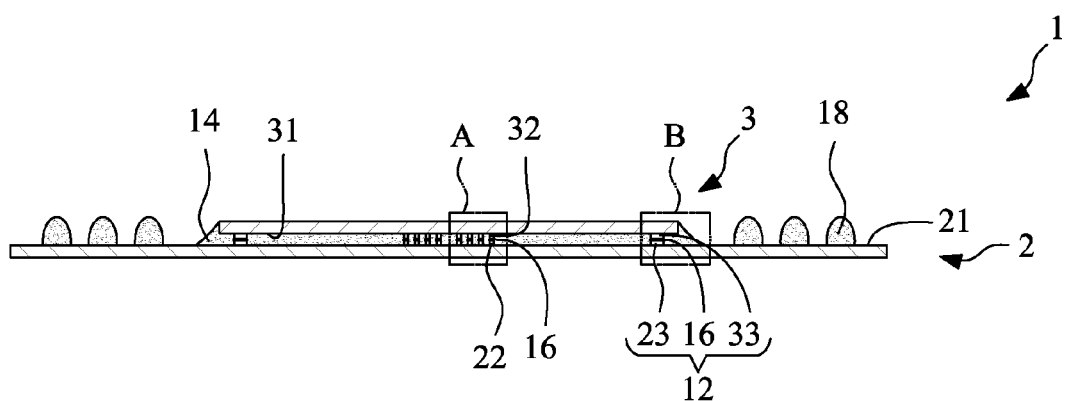
FIG. 2 illustrates a cross-sectional view of the semiconductor device shown in FIG. 1 taken along line 2-2 of FIG. 1.

FIG. 1 illustrates a top view of a semiconductor device 1 according to some embodiments of the present disclosure. FIG. 2 illustrates a cross-sectional view of the semiconductor device 1 taken along line 2-2 of FIG. 1. The semiconductor device 1 includes a first semiconductor die 2, a second semiconductor die 3, a plurality of supporting structures 12, a plurality of connecting structures 16 and an underfill 14. The first semiconductor die 2 may be a mother die, and includes a first active surface 21 and a plurality of first bumps 22 disposed adjacent to the first active surface 21. In some embodiments, a thickness of the first semiconductor die 2 may be less than about 75 μm. The second semiconductor die 3 may be a daughter die, and includes a second active surface 31 and a plurality of second bumps 32 disposed adjacent to the second active surface 31. In some embodiments, a thickness of the second semiconductor die 3 may be less than about 75 μm. The second active surface 31 of the second semiconductor die 3 faces the first active surface 21 of the first semiconductor die 2, and the second bumps 32 are bonded to respective first bumps 22 by the connecting structures 16, which can include a solder. That is, the second semiconductor die 3 is attached to the first semiconductor die 2 by flip chip bonding.

The supporting structures 12 are disposed between the first active surface 21 of the first semiconductor die 2 and the second active surface 31 of the second semiconductor die 3. As shown in FIG. 1 and FIG. 2, the supporting structures 12 do not perform an electrical function and are disposed on a peripheral region of the second active surface 31 of the second semiconductor die 3; for example, the supporting structures 12 may be electrically isolated from a circuit layer of the second semiconductor die 3, may be electrically isolated from a circuit layer of the first semiconductor die 2, or may be formed from an electrically insulating material. In some embodiments, the supporting structures 12 are disposed at four corners of the second semiconductor die 3. However, the supporting structures 12 may be disposed at other positions in the peripheral region of the second semiconductor die 3. To provide improved support, the positions of the supporting structures 12 may be symmetrical to each other.

As shown in FIG. 1 and FIG. 2, the supporting structures 12 are disposed within an area that the second semiconductor die 3 projects onto the first semiconductor die 2. That is, the supporting structures 12 are disposed under the second semiconductor die 3. Further, in some embodiments, each of the supporting structures 12 includes a first dummy bump 23 and a second dummy bump 33 bonded to a corresponding first dummy bump 23 by a corresponding connecting structure 16, which can include a solder. It is noted that the first dummy bump 23 and the second dummy bump 33 do not perform an electrical function, whereas the first bumps 22 and the second bumps 32 perform an electrical function. Therefore, the first dummy bumps 23 are additional dummy bumps of the first semiconductor die 2, the second dummy bumps 33 are the additional dummy bumps of the second semiconductor die 3, and the first dummy bumps 23 and the second dummy bumps 33 do not affect an original layout of the first bumps 22 and the second bumps 32. A size (e.g., a width or a diameter) of the first dummy bumps 23 or the second dummy bumps 33 may be the same as or different from a size of the first bumps 22 or the second bumps 32.

As shown in FIG. 1 and FIG. 2, each of the second bumps 32 are disposed within a bump area 34. A pitch between the second bumps 32 of the second semiconductor die 3 may be a fine pitch (e.g., the pitch may be less than about 40 μm) and the second bumps 32 of the second semiconductor die 3 may be disposed so as to be concentrated in a central area of the second semiconductor die 3 (that is, the second bumps 32 of the second semiconductor die 3 are not evenly distributed on the entire second active surface 31 of the second semiconductor die 3). For example, a size of the bump area 34 is less than about 80%, less than about 70%, less than about 60%, less than about 20%, less than about 15%, or even smaller than a total area of the second active surface 31 of the second semiconductor die 3. In some embodiments, the total area of the second active surface 31 of the second semiconductor die 3 is about 7 millimeters (mm)*7 mm, and the size of the bump area 34 is about 6 mm*1 mm. Thus, a maximum distance $L_1$ between an outermost second bump 32 and a side surface 37 of the second semiconductor die 3 is greater than about one fourth or greater than about one third of a maximum width W of the second semiconductor die 3. Therefore, there is a large peripheral region of the second semiconductor die 3 that is not supported by the second bumps 32 of the second semiconductor die 3, and, in the absence of the supporting structures 12, would otherwise be suspended, and would result in a convex warpage of the second semiconductor die 3 due to gravity.

As shown in FIG. 1 and FIG. 2, the supporting structures 12 (each including the first dummy bump 23 and the second dummy bump 33) provide mechanical and physical supports at the peripheral region of the second semiconductor die 3 so as to reduce the warpage of the second semiconductor die 3; thus, a narrow gap between the corners of the second semiconductor die 3 and the first active surface 21 of the first semiconductor die 2 may be avoided. That is, the supporting structures 12 may provide a consistent standoff between the second active surface 31 of the second semiconductor die 3 and the first active surface 21 of the first semiconductor die 2, and gaps between the second active surface 31 of the second semiconductor die 3 and the first active surface 21 of the first semiconductor die 2 at various positions are substantially equal to each other. Further, the supporting structures 12 are electrically isolated from each other. That is, the supporting structures 12 may be represented as dots or discrete regions from a top view, rather than a long continuous strip or ring wall, so as to facilitate a flow of the underfill 14. In addition, improved alignment and joint formation between the second bumps 32 of the second semiconductor die 3 and the first bumps 22 of the first semiconductor die 2 may be obtained after a reflow process, since a variation of warpage of the second semiconductor die 3 is reduced.

The underfill 14 fills a space between the second active surface 31 of the second semiconductor die 3 and the first active surface 21 of the first semiconductor die 2 to cover and protect the first bumps 22, the second bumps 32 and the supporting structures 12. In some embodiments, the semiconductor device 1 further includes at least one interconnection structure 18 (e.g., a solder ball or bump) disposed adjacent to the first active surface 21 of the first semiconductor die 2 for external connection. The interconnection structure 18 may be electrically to the first bumps 22.

Figure 3:
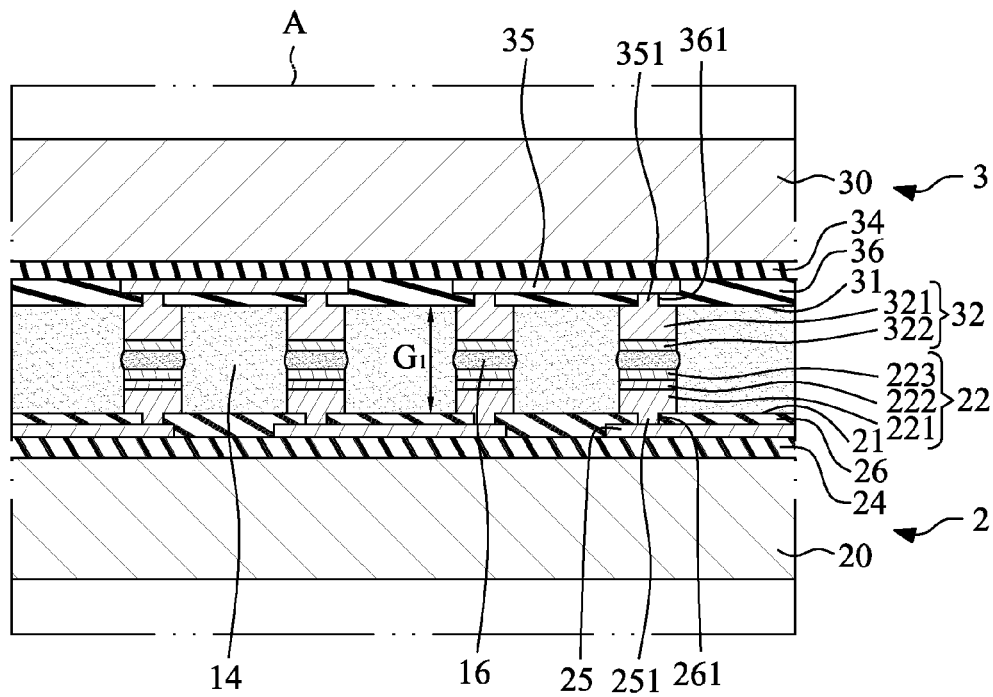
FIG. 3 illustrates an enlarged view of a region A of the semiconductor device shown in FIG. 2 according to some embodiments of the present disclosure.

FIG. 3 illustrates an enlarged view of a region A of the semiconductor device 1 shown in FIG. 2 according to some embodiments of the present disclosure. The first semiconductor die 2 includes a die body 20, a passivation layer 24, a patterned circuit layer 25, a plurality of conductive vias 251, a protection layer 26 and the first bumps 22. The die body 20 includes a semiconductor material such as silicon. The passivation layer 24 is disposed on the die body 20, and a material of the passivation layer 24 may be, for example, polyimide (PI) or another polymer. The patterned circuit layer 25 is disposed on the passivation layer 24. The protection layer 26 covers the patterned circuit layer 25 and the passivation layer 24, and defines a plurality of through holes 261. A top surface of the protection layer 26 corresponds to the first active surface 21. A material of the protection layer 26 may be the same as or different from the material of the passivation layer 24. The conductive vias 251 are disposed in the through holes 261 of the protection layer 26 so as to physically and electrically connect the patterned circuit layer 25 and the first bumps 22. Each of the first bumps 22 includes a main portion 221, a barrier layer 222 and a wetting layer 223. Materials of the main portion 221, the barrier layer 222 and the wetting layer 223 may be, for example, copper, nickel and gold, respectively. In some embodiments, the main portion 221 and the conductive via 251 are formed concurrently and integrally.

The second semiconductor die 3 includes a die body 30, a passivation layer 34, a patterned circuit layer 35, a plurality of conductive vias 351, a protection layer 36 and the second bumps 32. The die body 30 includes a semiconductor material such as silicon. The passivation layer 34 is disposed on the die body 30, and a material of the passivation layer 34 may be, for example, PI or another polymer. The patterned circuit layer 35 is disposed on the passivation layer 34. The protection layer 36 covers the patterned circuit layer 35 and the passivation layer 34, and defines a plurality of through holes 361. A top surface of the protection layer 36 corresponds to the second active surface 31. A material of the protection layer 36 may be the same as or different from the material of the passivation layer 34. The conductive vias 351 are disposed in the through holes 361 of the protection layer 36 so as to physically and electrically connect the patterned circuit layer 35 and the second bumps 32. Each of the second bumps 32 includes a main portion 321 and a barrier layer 322. Materials of the main portion 321 and the barrier layer 322 may be, for example, copper and nickel, respectively. In some embodiments, the main portion 321 and the conductive via 351 are formed concurrently and integrally. A size of the first bump 22 may be the same as or different from a size of the second bump 32.

The connecting structure 16, which can include a solder, connects the wetting layer 223 of the first bump 22 and the barrier layer 322 of the second bump 32. A material of the connecting structure 16 may be, for example, tin (Sn) or tin/silver (Sn/Ag) alloys, an intermetallic compound (IMC) (e.g., $(Cu,Ni)_6Sn_5$ and $(Ni,Cu)_3Sn_4$) may be formed at a boundary between the connecting structure 16 and the wetting layer 223 of the first bump 22 and at a boundary between the connecting structure 16 and the barrier layer 322 of the second bump 32. In some embodiments, a gap $G_1$ between the second active surface 31 of the second semiconductor die 3 and the first active surface 21 of the first semiconductor die 2 at the illustrated position of FIG. 3 (e.g., a central position) is, for example, about 35 µm.

Figure 4:
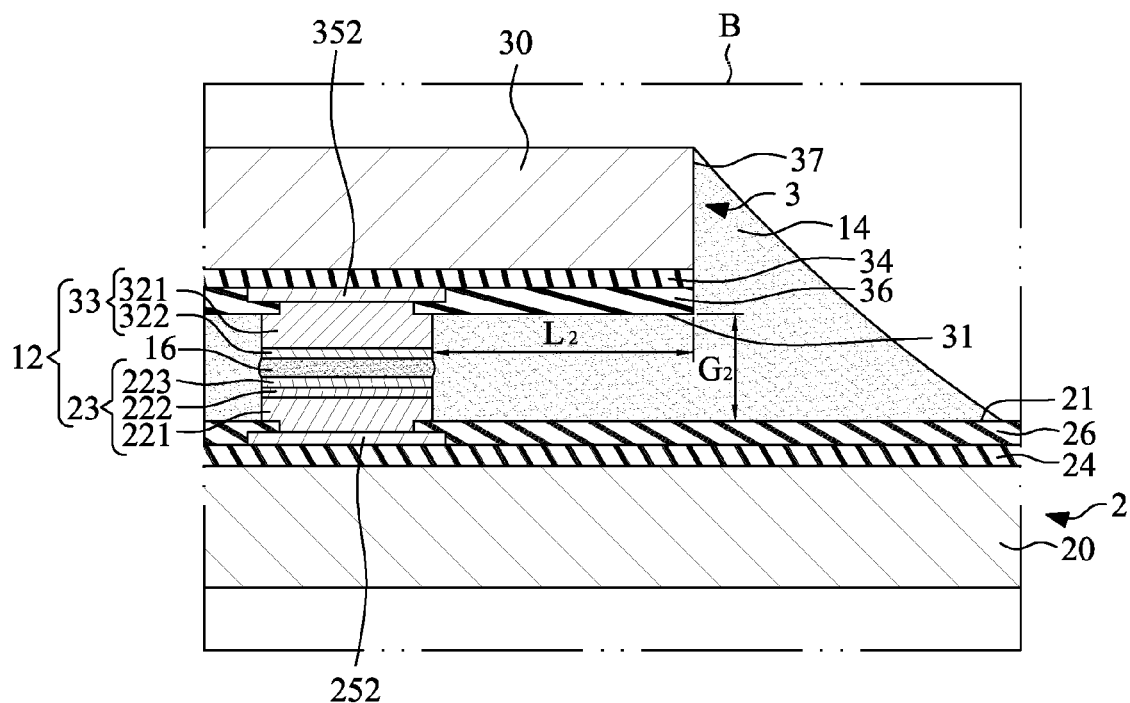
FIG. 4 illustrates an enlarged view of a region B of the semiconductor device shown in FIG. 2 according to some embodiments of the present disclosure.

FIG. 4 illustrates an enlarged view of a region B of the semiconductor device 1 shown in FIG. 2 according to some embodiments of the present disclosure. As shown in FIG. 4, a structure of the first dummy bump 23 is the same as, or is similar to, that of the first bump 22, and includes the main portion 221, the barrier layer 222 and the wetting layer 223. However, a structure of the first dummy bump 23 may be different from that of the first bump 22 in other embodiments. A size of the first dummy bump 23 may be the same as or different from the size of the first bump 22. The first dummy bump 23 is disposed on a dummy pad 252 on the passivation layer 24. A structure of the second dummy bump 33 is the same as, or is similar to, that of the second bump 32, and includes the main portion 321 and the barrier layer 322. However, the structure of the second dummy bump 33 may be different from that of the second bump 32 in other embodiments. A size of the second dummy bump 33 may be the same as or different from the size of the second bump 32. The second dummy bump 33 is disposed on a dummy pad 352 on the passivation layer 34. In some embodiments, a gap $G_2$ between the second active surface 31 of the second semiconductor die 3 and the first active surface 21 of the first semiconductor die 2 at the illustrated position of FIG. 4 (e.g., a peripheral position) is, for example, about 35 µm. That is, gaps (e.g., $G_1$ and $G_2$) between the second active surface 31 of the second semiconductor die 3 and the first active surface 21 of the first semiconductor die 2 at various positions are substantially equal to each other so as to facilitate the flow of the underfill 14. In other words, a height of each supporting structure 12 is substantially equal to a sum of heights of the first bump 22, the connecting structure 16 and the second bump 32; thus, a warpage of the second semiconductor die 3 may be less than about 3 µm. Therefore, a degree of flatness (e.g., total indicator reading (TIR) value) of the second active surface 31 of the second semiconductor die 3 may be less than about 3 µm.

As shown in FIG. 4, a minimum distance $L_2$ between the side surface 37 of the second semiconductor die 3 and a sidewall of the supporting structure 12 is about 0.05 mm or greater, about 0.1 mm or greater, or about 0.15 mm or greater. Thus, the supporting structures 12 are obscured from the top view. In some embodiments, the underfill 14 covers at least about one half of the thickness of the second semiconductor die 3. As shown in FIG. 4, the underfill 14 covers substantially the entire thickness of the second semiconductor die 3; thus, the entire side surface 37 of the second semiconductor die 3 is covered by the underfill 14, and is not exposed from the underfill 14.

Figure 5:
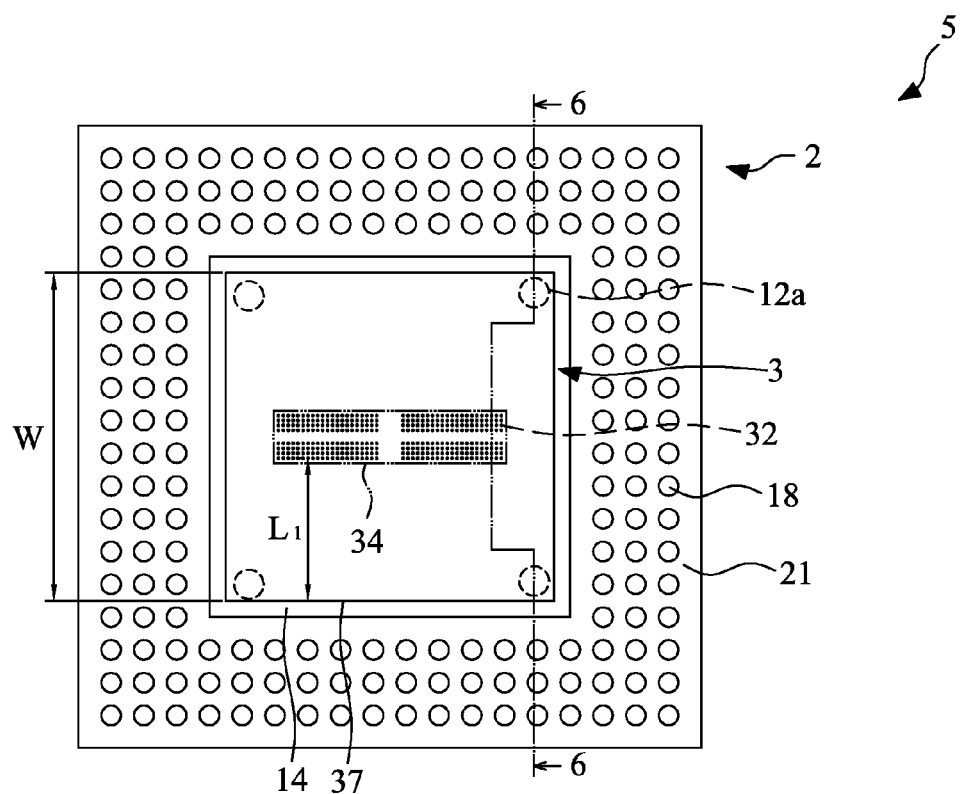
FIG. 5 illustrates a top view of a semiconductor device according to some embodiments of the present disclosure.
Figure 6:
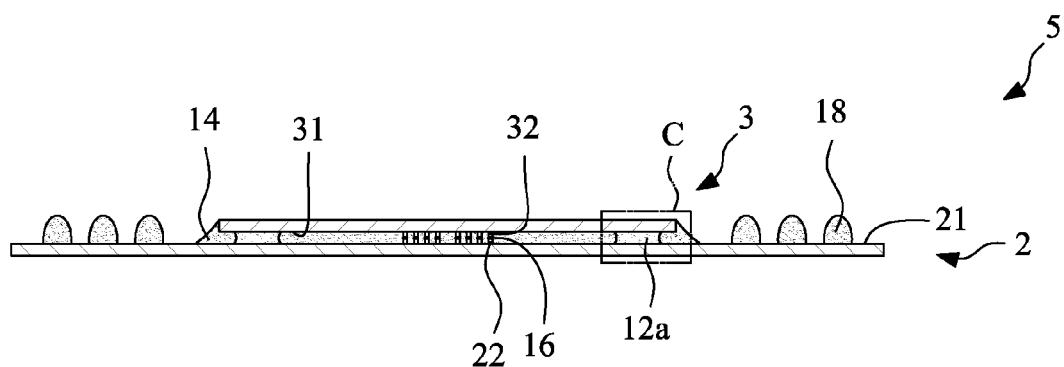
FIG. 6 illustrates a cross-sectional view of the semiconductor device shown in FIG. 5 taken along line 6-6 of FIG. 5.

FIG. 5 illustrates a top view of a semiconductor device 5 according to some embodiments of the present disclosure. FIG. 6 illustrates a cross-sectional view of the semiconductor device 5 taken along line 6-6 of FIG. 5. The semiconductor device 5 of FIG. 5 and FIG. 6 is similar to the semiconductor device 1 illustrated in FIG. 1 and FIG. 2 in some respects, with differences involving a structure and a material of supporting structures 12a. The semiconductor device 5 includes the first semiconductor die 2, the second semiconductor die 3, the supporting structures 12a, the connecting structures 16 and the underfill 14. The first semiconductor die 2, the second semiconductor die 3, the connecting structures 16 and the underfill 14 of FIG. 5 and FIG. 6 may be similarly configured as the first semiconductor die 2, the second semiconductor die 3, the connecting structures 16 and the underfill 14 of FIG. 1 and FIG. 2. The supporting structures 12a are cured from a supporting material (see FIG. 12) rather than including a combination of dummy bumps 23, 33 (as shown FIG. 1 and FIG. 2). That is, the supporting structure 12a is a monolithic structure, and is formed from an adhesive thermoset composition.

In some embodiments, a gel-point temperature (curing temperature) of the supporting material is higher than a melting temperature of a material of the connecting structure 16. That is, the supporting material is in a B-stage state (semi-melted state) at the melting temperature of the connecting structure 16. Therefore, a reflow process is described as follows. Firstly, the supporting material can support a peripheral region of the second active surface 31 of the second semiconductor die 3 at room temperature so as to reduce a convex warpage of the second semiconductor die 3. Then, the semiconductor device 5 is heated to a reflow temperature, the material of the connecting structure 16 is melted and the supporting material is in the B-stage state (semi-melted state) so as to adhere to both the second active surface 31 of the second semiconductor die 3 and the first active surface 21 of the first semiconductor die 2, thereby reducing a concave warpage of the second semiconductor die 3. That is, the supporting material adheres to both the second active surface 31 of the second semiconductor die 3 and the first active surface 21 of the first semiconductor die 2 when the warpage of the second semiconductor die 3 is about zero. Then, as the temperature rises further to reach the gel-point temperature (curing temperature) of the supporting material, the supporting material is cured and becomes solid state (C-stage state) so as to form the supporting structures 12a. Then, the temperature drops to room temperature, the connecting structure 16 is solidified, and the supporting structures 12a remain in a solid state; thus, gaps between the second active surface 31 of the second semiconductor die 3 and the first active surface 21 of the first semiconductor die 2 at various positions are substantially equal to each other.

In comparison, if a gel-point temperature (curing temperature) of a thermoset composition is lower than the melting temperature of the material of the connecting structure 16, the thermoset composition is in a C-stage state (solid state) before the temperature reaches the melting temperature of the connecting structure 16. Thus, the thermoset composition may adhere to both the second active surface 31 of the second semiconductor die 3 and the first active surface 21 of the first semiconductor die 2 when the second semiconductor die 3 has a convex warpage. Therefore, the second semiconductor die 3 may remain in a state of convex warpage throughout the reflow process.

As shown in FIG. 5 and FIG. 6, the supporting structures 12a are disposed between the first active surface 21 of the first semiconductor die 2 and the second active surface 31 of the second semiconductor die 3. The supporting structures 12a do not perform an electrical function and are disposed on a peripheral region of the second active surface 31 of the second semiconductor die 3. In some embodiments, the supporting structures 12a are disposed at four corners of the second semiconductor die 3. However, the supporting structures 12a may be disposed at other positions in the peripheral region of the second semiconductor die 3. To provide improved support, the positions of the supporting structures 12a may be symmetrical to each other.

As shown in FIG. 5 and FIG. 6, the supporting structures 12a are disposed within an area that the second semiconductor die 3 projects onto the first semiconductor die 2. That is, the supporting structures 12a are disposed under the second semiconductor die 3. Further, the supporting structures 12a are additional dummy structures between the first semiconductor die 2 and the second semiconductor die 3; thus, the supporting structures 12a do not affect an original layout of the first bumps 22 and the second bumps 32.

As shown in FIGS. 5 and 6, the supporting structures 12a provide mechanical and physical supports at the peripheral region of the second semiconductor die 3 so as to reduce the warpage of the second semiconductor die 3; thus, a narrow gap between the corners of the second semiconductor die 3 and the first active surface 21 of the first semiconductor die 2 may be avoided. That is, the supporting structures 12a may provide a consistent standoff between the second active surface 31 of the second semiconductor die 3 and the first active surface 21 of the first semiconductor die 2, and gaps between the second active surface 31 of the second semiconductor die 3 and the first active surface 21 of the first semiconductor die 2 at various positions are substantially equal to each other. Further, the supporting structures 12a are electrically isolated from each other. That is, the supporting structures 12a may be represented as dots or discrete regions from a top view, rather than a long continuous strip or ring wall, so as to facilitate a flow of the underfill 14. In addition, improved alignment and joint formation between the second bumps 32 of the second semiconductor die 3 and the first bumps 22 of the first semiconductor die 2 may be obtained after a reflow process, since a variation of warpage of the second semiconductor die 3 is reduced.

Figure 7:
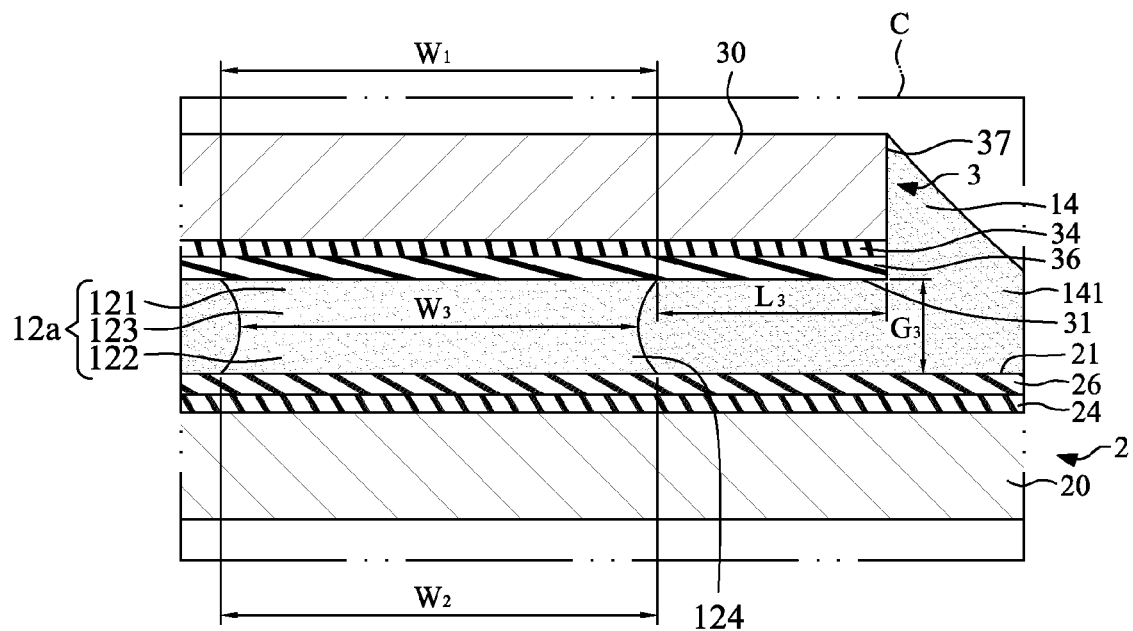
FIG. 7 illustrates an enlarged view of a region C of the semiconductor device shown in FIG. 6 according to some embodiments of the present disclosure.

FIG. 7 illustrates an enlarged view of a region C of the semiconductor device 5 shown in FIG. 6 according to some embodiments of the present disclosure. As shown in FIG. 7, each supporting structure 12a adheres to the protection layer 36 of the second semiconductor die 3 and the protection layer 26 of the first semiconductor die 2, has an inwardly curved or concave lateral profile, and includes an upper portion 121, a lower portion 122 and a neck portion 123. The upper portion 121 is in contact with the second active surface 31 of the second semiconductor die 3, and has a first width $W_1$. The lower portion 122 is in contact with the first active surface 21 of the first semiconductor die 2, and has a second width $W_2$. The neck portion 123 is disposed substantially as a middle portion of the supporting structure 12a, and has a third width $W_3$. The first width $W_1$ is substantially equal to the second width $W_2$, and the third width $W_3$ is less than the first width $W_1$ or the second width $W_2$. In some embodiments, the first width $W_1$ or the second width $W_2$ may be about 0.5 mm to about 1.5 mm, and the first width $W_1$ or the second width $W_2$ may be at least about 1.15 times the third width $W_3$.

In some embodiments, a gap $G_3$ between the second active surface 31 of the second semiconductor die 3 and the first active surface 21 of the first semiconductor die 2 at the illustrated position of FIG. 7 is, for example, about 35 μm. That is, gaps between the second active surface 31 of the second semiconductor die 3 and the first active surface 21 of the first semiconductor die 2 at various positions are substantially equal to each other so as to facilitate the flow of the underfill 14. In other words, a height of the supporting structure 12a is substantially equal to a sum of heights of the first bump 22, the connecting structure 16 and the second bump 32; thus, a warpage of the second semiconductor die 3 may be less than about 3 μm. Therefore, a degree of flatness (e.g., TIR value) of the second active surface 31 of the second semiconductor die 3 may be less than about 3 μm.

As shown in FIG. 7, a minimum distance $L_3$ between the side surface 37 of the second semiconductor die 3 and a sidewall of the supporting structure 12a is about 0.05 mm or greater, about 0.1 mm or greater, or about 0.15 mm or greater. Thus, the supporting structures 12a are obscured from the top view. As shown in FIG. 7, the underfill 14 covers substantially the entire thickness of the second semiconductor die 3; thus, the entire side surface 37 of the second semiconductor die 3 is covered by the underfill 14, and is not exposed from the underfill 14.

Each of the supporting structures 12a includes a plurality of first fillers 124 such as inorganic (e.g., silica or $SiO_2$) fillers, and the underfill 14 includes a plurality of second fillers 141 such as inorganic (e.g., $SiO_2$) fillers. As can be measured from a scanning electron microscopy (SEM) image, an area percentage of the second fillers 141 per unit cross-sectional area of the underfill 14 is at least about five times greater, at least about seven times greater, or at least about ten times greater than an area percentage of the first fillers 124 per unit cross-sectional area of the supporting structure 12a. That is, if a particle size of the first fillers 124 is substantially equal to a particle size of the second fillers 141, an amount (e.g., a concentration) of the second fillers 141 per unit cross-sectional area of the underfill 14 is at least about five times greater, at least about seven times greater, or at least about ten times greater than an amount of the first fillers 124 per unit cross-sectional area of the supporting structure 12a. In some embodiments, the area percentage of the second fillers 141 per unit area of the underfill 14 is about 60%/mm², and the area percentage of the first fillers 124 per unit area of the supporting structure 12a is about 6%/mm².

Before being cured, the supporting material of some embodiments includes an epoxy resin in an amount of about 60 wt. % to about 85 wt. % based on a total weight of the supporting material, and the first fillers 124 in an amount of about 5 wt. % to about 10 wt. % based on the total weight of the supporting material. It is noted that a composition of the supporting material may be similar to a composition of the underfill 14 in some respects before curing. In some embodiments, the supporting material is ADE480D from Panasonic Corporation, and includes a bis phenol A type epoxy resin, a bis phenol F type epoxy resin, inorganic $SiO_2$ fillers (e.g., as the first fillers 124), an amine type hardener and carbon black, where the bis phenol A type epoxy resin is about 45 wt. % to about 50 wt. % based on a total weight of the supporting material, the bis phenol F type epoxy resin is about 15 wt. % to about 35 wt. % based on the total weight of the supporting material, the inorganic $SiO_2$ fillers is about 6 wt. % based on the total weight of the supporting material, the amine type hardener is about 10 wt. % to about 15 wt. % based on the total weight of the supporting material, and carbon black is about 0.2 wt. % based on the total weight of the supporting material. In comparison, the underfill 14 before curing may include a p-(2,3-epoxypropoxy)-N,N-bis(2,3-epoxypropyl)aniline, a bis phenol F type epoxy resin, inorganic $SiO_2$ fillers (e.g., as the second fillers 141), an amine type hardener, carbon black and additives, where the p-(2,3-epoxypropoxy)-N,N-bis(2,3-epoxypropyl)aniline is about 10 wt. % to about 20 wt. % based on a total weight of the underfill 14, the bis phenol F type epoxy resin is about 10 wt. % to about 20 wt. % based on total weight of the underfill 14, the inorganic $SiO_2$ fillers is about 50 wt. % to about 60 wt. % based on the total weight of the underfill 14, the amine type hardener is about 10 wt. % to about 20 wt. % based on the total weight of the underfill 14, carbon black is greater than about 1 wt. % based on the total weight of the underfill 14, and the additives are greater than about 5 wt. % based on the total weight of the underfill 14. Thus, the weight percent of the second fillers 141 of the underfill 14 is at least about five times greater, at least about seven times greater, or at least about ten times greater than the weight percent of the first fillers 124 of the supporting material.

Figure 8:
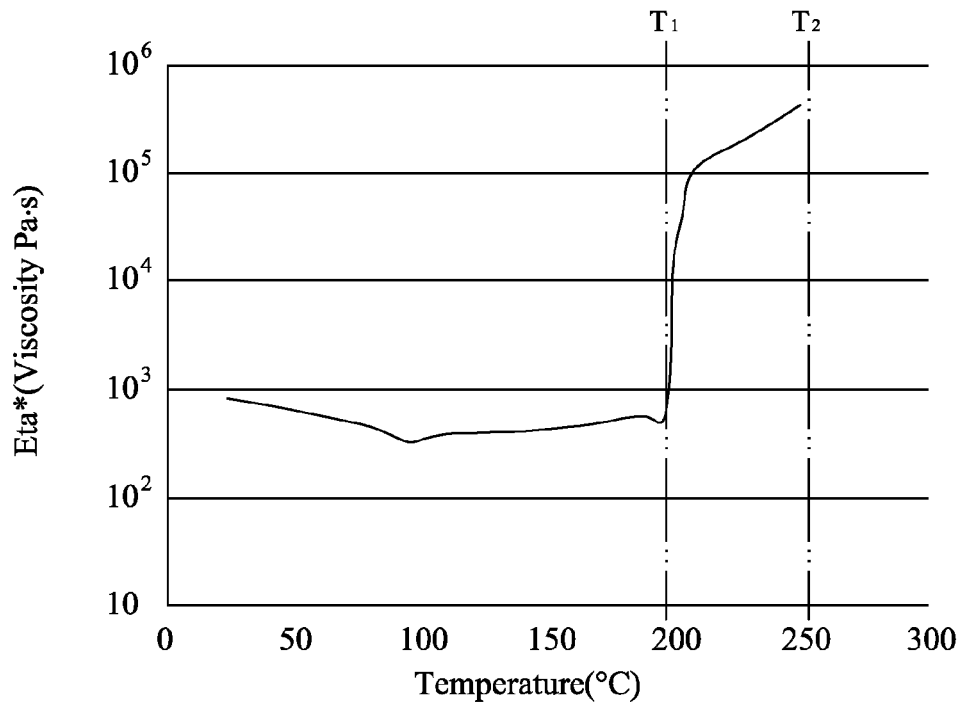
FIG. 8 illustrates a relationship between viscosity and temperature of a supporting material according to some embodiments of the present disclosure.

FIG. 8 illustrates a relationship between viscosity and temperature of a supporting material according to some embodiments of the present disclosure. For example, FIG. 8 illustrates a material characteristic of the supporting material that is ADE480D from Panasonic Corporation as stated above. As shown in FIG. 8, when the temperature is under about 200° C., the supporting material is in an A-stage state with a viscosity of about 800 Pa·s to 900 Pa·s. When the temperature is in a range of about 200° C. to about 250° C., the supporting material is in a B-stage state (semi-melted state) with a viscosity of about 900 Pa·s to about 500,000 Pa·s. The viscosity of the supporting material undergoes a sharp rise at a first temperature $T_1$, such as about 200° C., which is the temperature at which the supporting material converts to the B-stage state from the A-stage state. When the temperature exceeds about 250° C., the supporting material in a C-stage state (cured state or solid state) with a viscosity of greater than about 500,000 Pa·s. The supporting material is cured or solidified at a second temperature $T_2$, such as about 250° C., which is the temperature at which the supporting material converts to the C-stage state from the B-stage state. The second temperature $T_2$ is referred to as a gel-point temperature or curing temperature. It is noted that, in some embodiments, a melting temperature of a connecting structure (e.g., the connecting structure 16) is about 220° C.; thus, the gel-point temperature (curing temperature) $T_2$ of the supporting material is greater than the melting temperature of the connecting structure 16, and the supporting material is in the B-stage state (semi-melted state) at the melting temperature of the connecting structure 16. Further, the viscosity of the supporting material is about 1,000 Pa·s to about 100,000 Pa·s at the melting temperature of the connecting structure 16.

Figure 9:
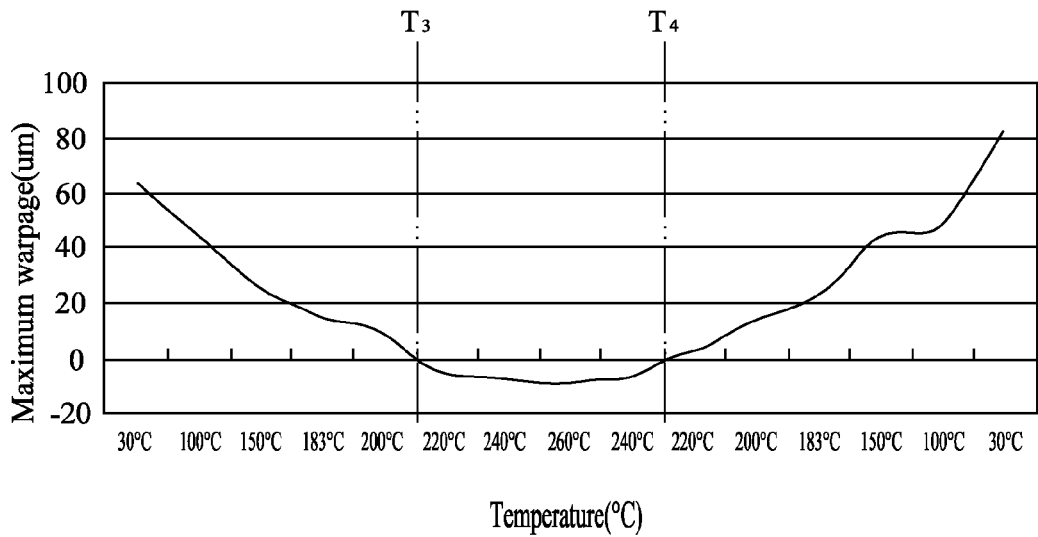
FIG. 9 illustrates a relationship between maximum warpage and temperature of a second semiconductor die of a semiconductor device without supporting structures according to a comparative embodiment of the present disclosure.

FIG. 9 illustrates a relationship between maximum warpage and temperature of a second semiconductor die of a semiconductor device without supporting structures according to a comparative embodiment of the present disclosure. A value of the maximum warpage is a difference between a height of a highest point of a second active surface of the second semiconductor die and a height of a lowest point of the second active surface of the second semiconductor die. An absolute value of the maximum warpage refers to a degree of the warpage. A positive value of the maximum warpage is indicative of convex warpage, and a negative value of the maximum warpage is indicative of concave warpage. If the semiconductor device omits supporting structures to support a peripheral region of the second semiconductor die, the peripheral region of the second semiconductor die may warp freely. The warpage behavior of the second semiconductor die during a reflow process is described as follows. Under a third temperature $T_3$, such as about 210° C., the warpage of the second semiconductor die is a convex warpage. As the temperature rises, the warpage of the second semiconductor die reduces. At the third temperature $T_3$, such as about 210° C., the warpage of the second semiconductor die converts to a concave warpage from the convex warpage. That is, the warpage of the second semiconductor die is about zero at the third temperature $T_3$. Then, as the temperature rises to a maximum temperature of the reflow process, the warpage of the second semiconductor die increases to its maximum negative value. Then, as the temperature drops, the warpage of the second semiconductor die reduces. At a fourth temperature $T_4$, such as about 230° C., the warpage of the second semiconductor die converts back to the convex warpage from the concave warpage. That is, the warpage of the second semiconductor die is about zero at the fourth temperature $T_4$, such as about 230° C.

Such variation of the warpage of the second semiconductor die can result in misalignment and joint failure between first bumps of a first semiconductor die and second bumps of the second semiconductor die, which can adversely affect a reliability of the semiconductor device. In addition, when the convex warpage of the second semiconductor die occurs at room temperature, a gap between a corner of the second semiconductor die and a first active surface of the first semiconductor die is very small or even zero, which renders it difficult for an underfill to enter a space between the first semiconductor die and the second semiconductor die to cover and protect the first bumps and the second bumps.

To address the above issues, the supporting structures 12, 12a are provided in the semiconductor devices 1, 5. In the semiconductor device 1 (see FIG. 1 to FIG. 4), the supporting structures 12 include dummy bumps, which provide mechanical and physical supports at the peripheral region of the second semiconductor die 3 at room temperature, so as to reduce convex warpage of the second semiconductor die 3. Further, the connecting structures 16 between the first dummy bumps 23 and the second dummy bumps 33 are melted and solidified substantially concurrently with the connecting structures 16 between the first bumps 22 and the second bumps 32; thus, the connecting structures 16 can hold the first dummy bumps 23 and the second dummy bumps 33 when the temperature exceeds the third temperature $T_3$, such as about 210° C., so as to reduce concave warpage. In addition, in the semiconductor device 5 (see FIG. 5 to FIG. 7), the supporting structures 12a of the semiconductor device 5 are cured from a thermoset supporting material. Therefore, the reflow process is described as follows. Firstly, the supporting material can support the peripheral region of the second active surface 31 of the second semiconductor die 3 at room temperature so as to reduce convex warpage of the second semiconductor die 3, since the supporting material in the A-stage state has a viscosity of about 800 Pa·s to about 900 Pa·s. Then, when the semiconductor device 5 is heated to the third temperature $T_3$, such as about 210° C. ($T_1 \le T_3 \le T_2$), the connecting structure 16 is melted and the supporting material converts to the B-stage state (semi-melted state) so as to adhere to both the second active surface 31 of the second semiconductor die 3 and the first active surface 21 of the first semiconductor die 2. That is, the supporting material adheres to both the second active surface 31 of the second semiconductor die 3 and the first active surface 21 of the first semiconductor die 2 when the warpage of the second semiconductor die 3 is about zero. Then, as the temperature rises further to reach the gel-point temperature (curing temperature) $T_2$ of the supporting material, the supporting material is cured and become solid state (C-stage state) so as to form the supporting structures 12a and prevent concave warpage of the second semiconductor die 3. Then, the temperature drops to room temperature, the connecting structures 16 are solidified, and the supporting structures 12a remain in a solid state; thus, the gaps between the second active surface 31 of the second semiconductor die 3 and the first active surface 21 of the first semiconductor die 2 at various positions are substantially equal to each other.

Figure 10:
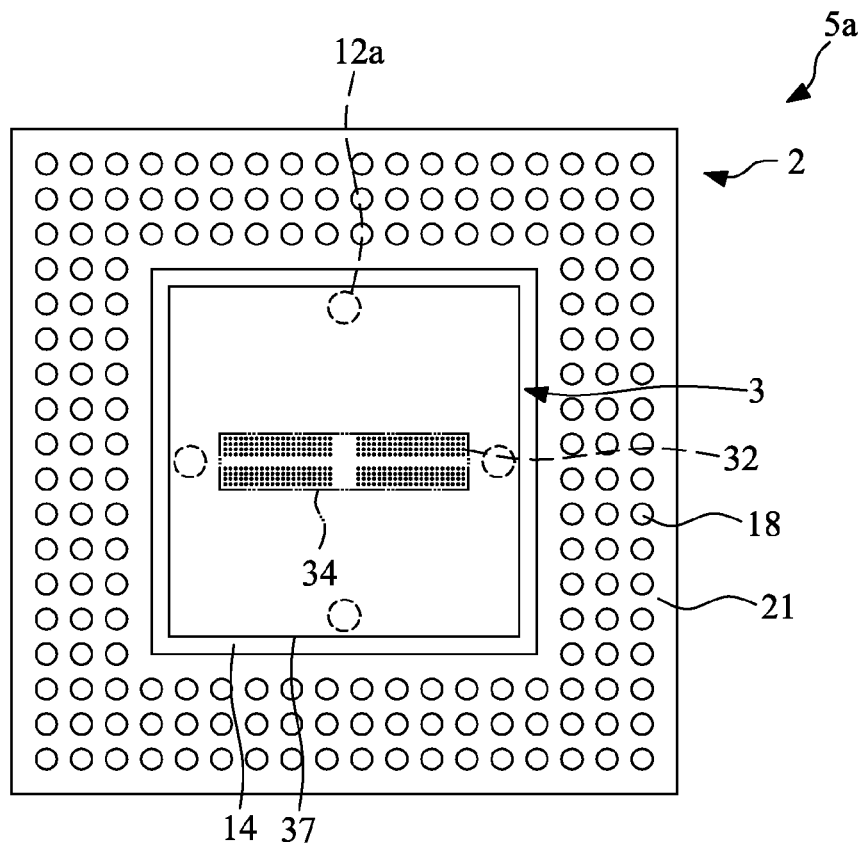
FIG. 10 illustrates a top view of a semiconductor device according to some embodiments of the present disclosure.

FIG. 10 illustrates a top view of a semiconductor device 5a according to some embodiments of the present disclosure. The semiconductor device 5a of FIG. 10 is similar to the semiconductor device 5 illustrated in FIG. 5 in some respects, with differences involving positions of the supporting structures 12a. In the semiconductor device 5 illustrated in FIG. 5, the supporting structures 12a are disposed at respective corners of the second semiconductor die 3. In the semiconductor device 5a illustrated in FIG. 10, each of the supporting structures 12a is disposed at about a middle portion between two corners of the second semiconductor die 3.

Figures 11, 12:
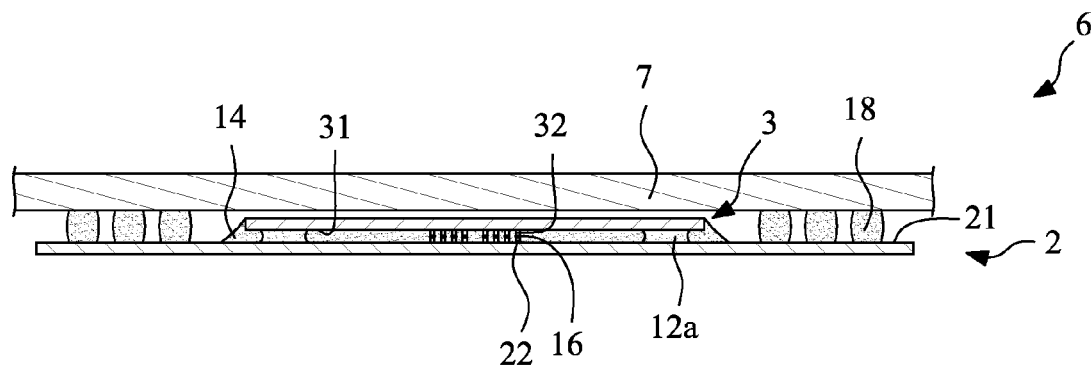
FIG. 11 illustrates a cross-sectional view of a semiconductor device according to some embodiments of the present disclosure.
FIG. 12, FIG. 13 and FIG. 14 illustrate a semiconductor manufacturing process according to some embodiments of the present disclosure.

FIG. 11 illustrates a cross-sectional view of a semiconductor device 6 according to some embodiments of the present disclosure. The semiconductor device 6 of FIG. 11 is similar to the semiconductor device 5 illustrated in FIG. 5 in some respects, except that a mother board 7 (e.g., a printed circuit board (PCB)) is attached to the semiconductor device 5 of FIG. 5, where the interconnection structures 18 connect the mother board 7 and the first active surface 21 of the first semiconductor die 2.

Figure 13:
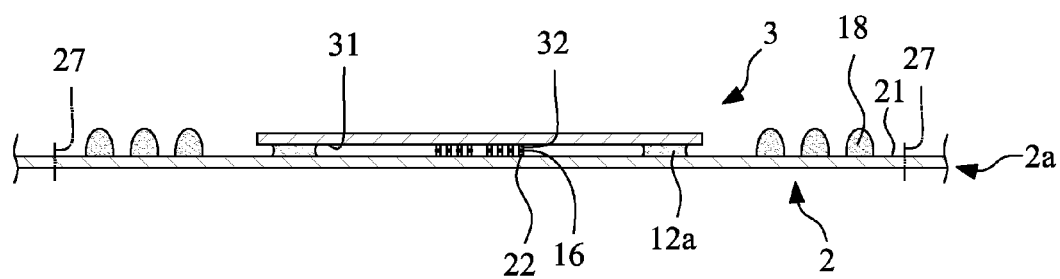
Figure 14:
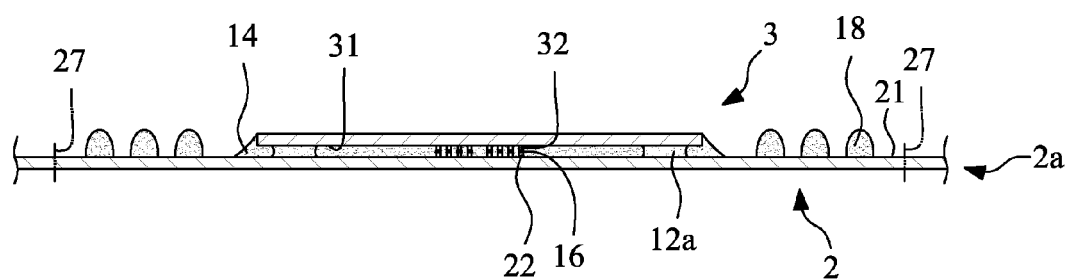

FIG. 12 to FIG. 14 illustrate a semiconductor manufacturing process according to some embodiments of the present disclosure. In the illustrated embodiments, the semiconductor manufacturing process is used to manufacture the semiconductor device 5 as shown in FIG. 5. Referring to FIG. 12, a first wafer 2a is provided. The first wafer 2a includes a plurality of first semiconductor dice 2 defined by cutting lines 27. Each of the first semiconductor dice 2 includes a first active surface 21 and a plurality of first bumps 22 disposed adjacent to the first active surface 21. Then, the interconnection structures 18 are formed adjacent to the first active surface 21. Then, supporting materials 11 are disposed on the first active surface 21 of the first semiconductor die 2, where the supporting materials 11 have a gel-point temperature (curing temperature). Meanwhile, each of the supporting materials 11 is substantially in a shape of hemisphere.

Then, the second semiconductor die 3 is provided. The second semiconductor die 3 includes the second active surface 31, the second bumps 32 and the connecting structures 16. The second bumps 32 are disposed adjacent to the second active surface 31, and each of the connecting structures 16 is disposed on a tip of a corresponding second bump 32.

Referring to FIG. 13, the second semiconductor die 3 is attached to the first semiconductor die 2 of the first wafer 2a by flip chip bonding, where each of the connecting structures 16 contacts a corresponding first bump 22. Then, a reflow process is conducted. The supporting materials 11 are in a B-stage state when the connecting structures 16 are melted, and then the supporting materials 11 are cured to form the supporting structures 12a at a maximum temperature of the reflow process.

Referring to FIG. 14, the underfill 14 is applied to fill the space between the second active surface 31 of the second semiconductor die 3 and the first active surface 21 of the first semiconductor die 2 to cover and protect the first bumps 22, the second bumps 32 and the supporting structures 12a. Since the gaps between the second active surface 31 of the second semiconductor die 3 and the first active surface 21 of the first semiconductor die 2 at various positions are substantially equal to each other due to the supporting structures 12a, the underfill 14 can enter the space readily. Then, the first wafer 2a is cut along the cutting lines 27 to obtain the semiconductor device 5 shown in FIG. 5.

Then, the semiconductor device 5 may be attached to the mother board 7 by bonding to the interconnection structures 18 to obtain the semiconductor device 6 shown in FIG. 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

In the description of some embodiments, a component provided "on" or "over" another component can encompass cases where the former component is directly on (e.g., in physical or direct contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a first semiconductor die including a first active surface and a plurality of first bumps disposed adjacent to the first active surface;
a second semiconductor die including a second active surface and a plurality of second bumps disposed adjacent to the second active surface, wherein the second bumps are bonded to respective ones of the first bumps; and
a plurality of supporting structures disposed between the first active surface of the first semiconductor die and the second active surface of the second semiconductor die, wherein the supporting structures are electrically isolated and are disposed adjacent to a peripheral region of the second active surface of the second semiconductor die, wherein each of the supporting structures includes a first dummy bump and a second dummy bump bonded to the first dummy bump.

2. The semiconductor device of claim 1, further comprising an underfill disposed between the first active surface of the first semiconductor die and the second active surface of the second semiconductor die to cover the first bumps, the second bumps and the supporting structures, wherein each of the supporting structures includes first fillers, the underfill includes second fillers, and a concentration of the second fillers in the underfill is at least five times greater than a concentration of the first fillers in the supporting structures.

3. The semiconductor device of claim 2, wherein each of the supporting structures adhere to both the second active surface of the second semiconductor die and the first active surface of the first semiconductor die.

4. The semiconductor device of claim 2, wherein at least one of the supporting structures has an inwardly curved lateral profile.

5. The semiconductor device of claim 1, wherein the supporting structures are disposed within an area of the first active surface onto which the second semiconductor die projects on the first semiconductor die.

6. The semiconductor device of claim 1, wherein the second bumps are disposed within a bump area, and a size of the bump area is less than 80% of a total area of the second active surface of the second semiconductor die.

7. The semiconductor device of claim 1, wherein a distance between an outermost one of the second bumps and a side surface of the second semiconductor die is greater than one fourth of a width of the second semiconductor die.

8. The semiconductor device of claim 1, wherein a distance between a side surface of the second semiconductor die and a sidewall of at least one of the supporting structures is 0.05 mm or greater.

9. The semiconductor device of claim 1, further comprising a mother board and at least one interconnection structure, wherein the interconnection structure connects the mother board and the first active surface of the first semiconductor die.

10. A semiconductor device, comprising:
 a first semiconductor die including a first active surface and a plurality of first bumps disposed adjacent to the first active surface;
 a second semiconductor die including a second active surface and a plurality of second bumps disposed adjacent to the second active surface;
 a plurality of connecting structures connecting the first bumps and respective ones of the second bumps; and
 a plurality of supporting structures disposed between the first active surface of the first semiconductor die and the second active surface of the second semiconductor die, wherein the supporting structures are cured from a supporting material, and a gel-point temperature of the supporting material is greater than a melting temperature of a material of the connecting structures.

11. The semiconductor device of claim 10, wherein the supporting material includes an epoxy resin in an amount of about 60 wt. % to about 85 wt. % based on a total weight of the supporting material.

12. The semiconductor device of claim 10, further comprising an underfill disposed between the first active surface of the first semiconductor die and the second active surface of the second semiconductor die, wherein each of the supporting structures includes first fillers, the underfill includes second fillers, and a concentration of the second fillers in the underfill is greater than a concentration of the first fillers in the supporting structures.

13. The semiconductor device of claim 10, wherein at least one of the supporting structures includes a first portion disposed adjacent to the first active surface, a second portion disposed adjacent to the second active surface, and a middle portion between the first portion and the second portion, and a width of the middle portion is less than a width of the first portion adjacent to the first active surface, and is less than a width of the second portion adjacent to the second active surface.

14. A semiconductor manufacturing process, comprising:
 (a) providing a first semiconductor die including a first active surface and a first bump disposed adjacent to the first active surface;
 (b) disposing a supporting material on the first active surface of the first semiconductor die;
 (c) attaching a second semiconductor die to the first semiconductor die, wherein the second semiconductor die includes a second active surface, a second bump and a connecting structure, the second bump is disposed adjacent to the second active surface, and the connecting structure is disposed between the second bump and the first bump; and
 (d) conducting a reflow process, wherein the supporting material is in a B-stage state when the connecting structure is melted.

15. The semiconductor manufacturing process of claim 14, wherein in (a), the first semiconductor die further includes at least one interconnection structure disposed adjacent to the first active surface, and after (d), the method further comprises:
 (e) bonding a mother board to the interconnection structure.

16. The semiconductor manufacturing process of claim 14, wherein in (b), the supporting material includes an epoxy resin in an amount of about 60 wt. % to about 85 wt. % based on a total weight of the supporting material, and a plurality of fillers in an amount of about 5 wt. % to about 10 wt. % based on the total weight of the supporting material.

17. The semiconductor manufacturing process of claim 16, wherein in (b), the epoxy resin includes a bis phenol A epoxy resin and a bis phenol F epoxy resin.

18. The semiconductor manufacturing process of claim 14, wherein in (d), the supporting material is cured at a temperature above a melting temperature of the connecting structure.

19. The semiconductor manufacturing process of claim 14, wherein in (d), a viscosity of the supporting material is about 1,000 Pa·s to about 100,000 Pa·s at a melting temperature of the connecting structure.

* * * * *